(12) United States Patent
Rong et al.

(10) Patent No.: US 6,377,492 B1
(45) Date of Patent: Apr. 23, 2002

(54) MEMORY ARCHITECTURE FOR READ AND WRITE AT THE SAME TIME USING A CONVENTIONAL CELL

(75) Inventors: Bor-Doou Rong, Chupei; Ghy-Bin Wang, Chun-Li, both of (TW)

(73) Assignee: Etron Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/809,839

(22) Filed: Mar. 19, 2001

(51) Int. Cl.[7] ................................. G11C 7/00
(52) U.S. Cl. ..................... 365/189.02; 365/189.04; 365/230.02
(58) Field of Search ............... 365/230.03, 230.02, 365/230.06, 189.01, 189.02, 189.04

(56) References Cited

U.S. PATENT DOCUMENTS

| | | | |
|---|---|---|---|
| 4,558,433 A | * 12/1985 | Bernstein | 365/189 |
| 4,616,341 A | * 10/1986 | Andersen et al. | 365/189 |
| 5,016,214 A | 5/1991 | Laymoun | 365/154 |
| 5,781,480 A | 7/1998 | Nogle et al. | 365/189.04 |
| 5,978,307 A | 11/1999 | Proebsting et al. | 365/230.05 |
| 5,982,700 A | 11/1999 | Proebsting | 365/230.05 |
| 5,999,478 A | 12/1999 | Proebsting | 265/230.05 |
| 6,052,327 A | 4/2000 | Reddy et al. | 365/230.05 |

* cited by examiner

Primary Examiner—David Nelms
Assistant Examiner—Thong Le
(74) Attorney, Agent, or Firm—George O. Saile; Stephen B. Ackerman

(57) ABSTRACT

A simultaneous read and write memory is shown. The memory is configured into a plurality of sections. Connected to each section is a wordline multiplexer which is used to select a wordline for reading or writing. A write wordline decoder and a read wordline decoder are each connected to all the wordline multiplexers. The multiplexers choose either a write wordline or a read wordline independently for each memory section. A write data path and a read data path are separately connected to each of the memory sections. With the separate write and read wordline addressing and the separate data paths for reading and writing, one section can be written simultaneous to the reading from a second section.

10 Claims, 3 Drawing Sheets

FIG. 1 – Prior Art

MEMORY ARCHITECTURE FOR READ AND WRITE AT THE SAME TIME USING A CONVENTIONAL CELL

BACKGROUND OF THE INVENTION

1. Field of Invention

The present invention relates to semiconductor memories and in particular simultaneous read and write operation.

2. Description of Related Art

Some buffer memory applications such as for use with a LCD controller require simultaneous read and write operations. In these applications different memory blocks are chosen for the read and write operations. One approach is to have a decoder associated with each memory block which requires considerable chip area. Another approach uses a dual port memory cell which requires dual wordlines and dual bit lines and again requires a large chip area.

U.S. Pat. No. 6,052,327 (Reddy et al.) is directed to a dual port programmable logic device memory array data is written into the device using a write column decoder and data selection logic, and data is read from the device using a read column decoder and data selection logic. U.S. Pat. No. 5,999,478 (Proebsting) is directed to tri-port memory buffers with fast fall through capability and methods of operation. The tri-port memory has a read port, a write port and a bi-directional input and output port. U.S. Pat. No. 5,982,700 (Proebsting) is directed to buffer memory arrays having nonlinear columns to provide parallel data access capability. U.S. Pat. No. 5,978,307 (Proebsting) is directed to integrated circuit memory devices with multi-port memory arrays for increasing data bandwidth. U.S. Pat. No. 5,781,480 (Nogle et al.) is related to a pipelined dual port integrated circuit memory. A control circuit controls access to the memory cells where simultaneous requests for access are serviced sequentially within a single cycle. U.S. Pat. No. 5,016,214 (Laymoun) is directed to memory cells with separate read and write paths using two pairs of bit lines.

In FIG. 1 is shown a memory with multiple array sections 10, 11, and 15 of prior art that allows a read from a first memory array section and a write to a second memory array section. Each memory array section has a separate wordline decoder 13, 14 and 12. A read and write multiplexer 16 under the control of a read and write controller 17 permits the reading of data from on array section while a second array section is being written. The multiple wordline decoders 13, 14 and 12 require a large chip area to implement and an alternative design is needed to reduce the size of the chip area needed to implement the simultaneous read and write capability.

SUMMARY OF THE INVENTION

It is an objective of the present invention to provide a memory using conventional memory cells with simultaneous read and write capability. It is also an objective of the present invention to provide the simultaneous read and write capability with a reduction in the required chip area. It is further an objective of the present invention to provide a separate read and write path. It is also an objective of the present invention to provide a memory with a plurality of sections and to enable one section for a write operation while enabling a second section for a read operation. It is still further an objective of the present invention to have separate read and write wordlines and to multiplex the read and write wordlines at each section of the memory.

In the present invention a multi-section memory using conventional memory cells is disclosed in which each section of the memory has a wordline multiplexer. Connected to each multiplexer are outputs from a read wordline decoder and a write wordline decoder. The wordline multiplexer for each section chooses a read wordline or a write wordline to be connected to the section. Separate write and read data paths are connected to each memory section to accommodate read and write operations.

BRIEF DESCRIPTION OF THE DRAWINGS

This invention will be described with reference to the accompanying drawings, wherein.

DETAILED DESCRIPTION OF THE PREFERRED EMBODIMENT

Figure 2:
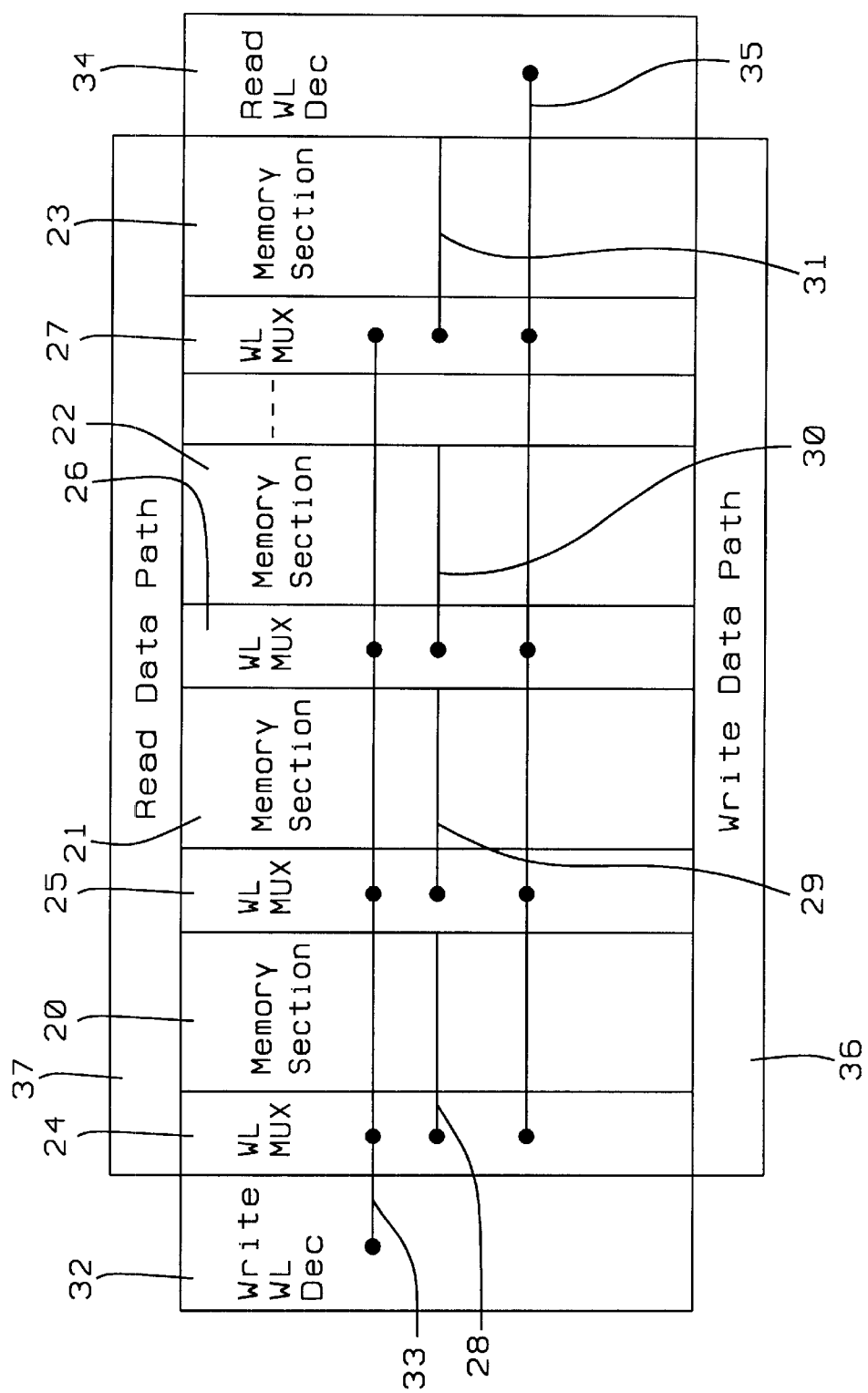
FIG. 2 is a block diagram of a memory of the preferred embodiment of the present invention.

In FIG. 2 is shown the preferred embodiment of the present invention. A memory comprising conventional memory cells is configured into a plurality of sections 20, 21, 22, and 23. Connected to the wordlines 28, 29, 30, and 31 of each section is a wordline multiplexer 24, 25, 26, and 27. A write wordline decoder 32 is connected to each wordline multiplexer 24, 25, 26 and 27 as shown by the sample connection 33. A read wordline decoder 34 is also connected to each wordline multiplexer 24, 25, 26 and 27, shown by sample connection 35. When a write is required to be done to a first section, for example memory section 20, the write wordline decoder decodes the wordline containing the memory cells to be written and communicates the wordline address to the wordline multiplexers 24, 25, 26 and 27. The wordline multiplexer 24 associated with the first memory section 20 selects the wordline address from the write wordline decoder and connects it to the first memory section 20. Data on the write data path 36 is then written to the memory locations on the wordline 28 addressed by the wordline decoder 32. When a read is required from a second memory section, for instance memory section 21, the read wordline decoder decodes the wordline containing the memory cells to be read and communicates the wordline address to the wordline multiplexers 24, 25, 26 and 27. The wordline multiplexer 25 associated with the second memory section 21 selects the wordline address from the read wordline decoder and connects it to the second memory section 21. Data is read out from the memory cells associated with the read wordline through the read data path 37. Since there are at least two independently addressable memory sections, for instance 20 and 21, each connected to a separate read and a separate write data path 36 and 37, then a simultaneous read and write operation can be carried out on the memory simultaneously where a write is done in the first memory section, for instance section 20, and a read is done in the second memory section, for instance section 21.

Figure 1:
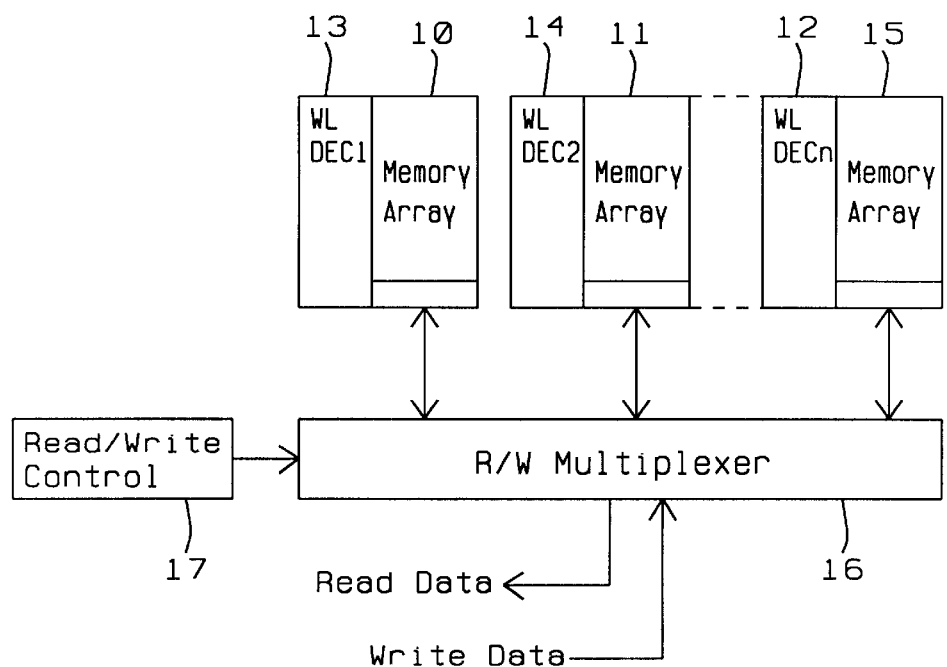
FIG. 1 is a block diagram of a simultaneous read and write memory of prior art.

Continuing to refer to FIG. 2, the inclusion of a wordline multiplexer 24, 25, 26 and 27 for each memory section 20, 21, 22 and 23 uses much less space than if a decoder is used with each memory section to provide simultaneous read and write operations. The total space required for the memory is much less than that of the prior art shown in FIG. 1 even though the present invention requires a write wordline decoder 32 and a read wordline decoder 34.

Figure 3:
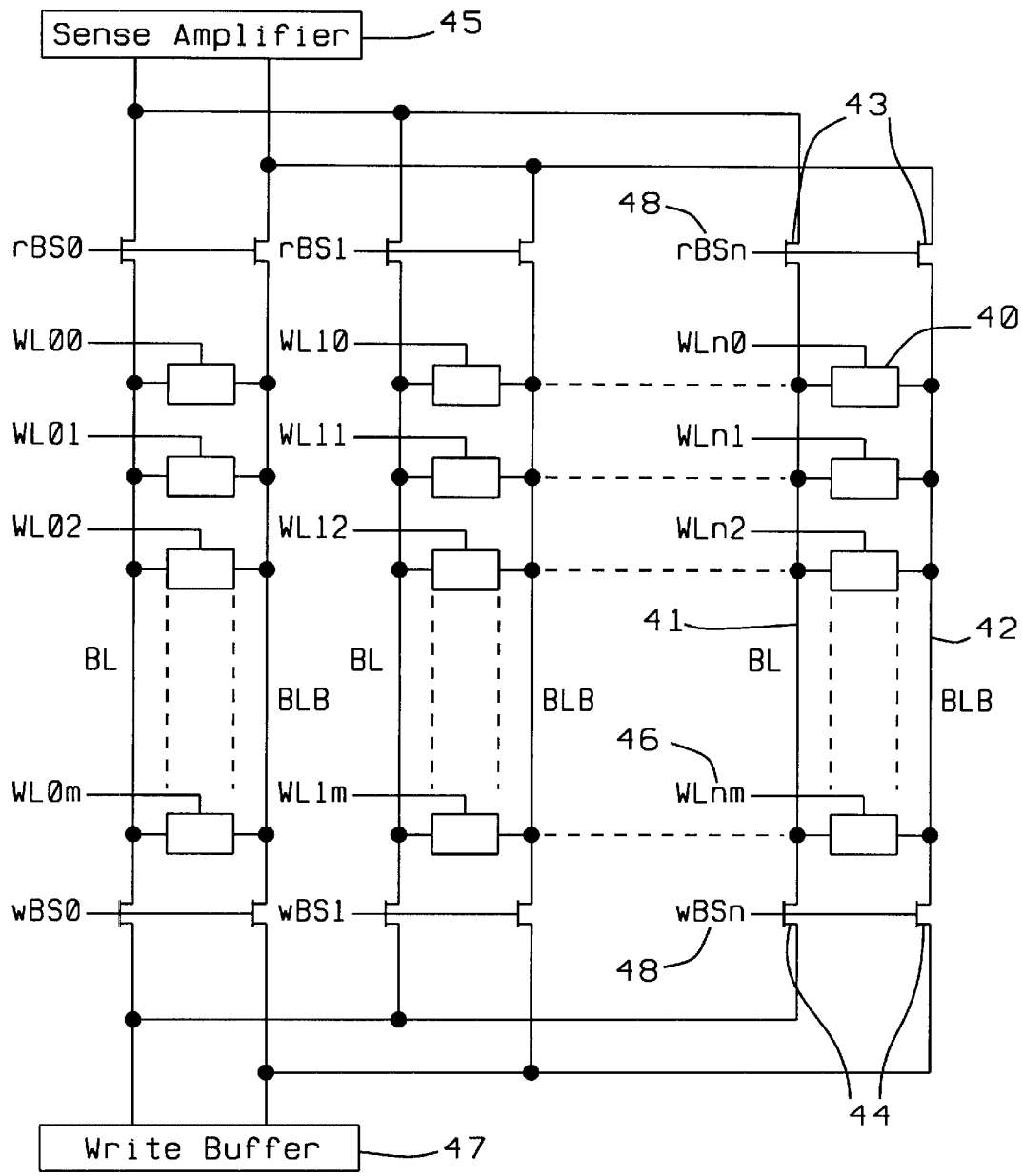
FIG. 3 is a schematic diagram showing the connection of the read and write data paths to the memory cells of the present invention.

Referring to FIG. 3, a schematic diagram of a memory array made of conventional memory cells 40 connected to permit simultaneous read and write operations. Columns of memory cells are connected between a bit line (BL) 41 and a bit line bar (BLB) 42. At one end of each column are two read bit switches 43 (one connected in series with BL and one connected in series with BLB), and at the other end of each column are two write bit switches 44 (one connected in series with BL and one connected in series with BLB). The read bit switches 43 connect the memory cells 40 of each column to the sense amplifier 45 to form a read data path 37 shown in FIG. 2. A read bit signal rBSn 48 activates the read bit switches 43 of a column to allow reading data from a memory cell activated by a wordline WLnm 46.

Continuing to refer to FIG. 3, at the end of each column opposite the read bit switches 43 are write bit switches 44. The write bit switches 44 connect the memory cells 40 of each column to the write buffer 45 to form a write data path 36 shown in FIG. 2. The write bit switches 44 connect a write buffer 47 to the BL 41 and BLB 42 of a column of memory cells. A write bit signal wBSn 49 activates the write bit switches 44 of a column to allow writing data to a memory cell 40 activated by a word line WLnm 46. Simultaneous reading and writing of the array of memory cells can occur with the restriction that the simultaneous read and write is not done in the same memory column. The wordlines WLnm 46 of each column are connected to a wordline multiplexer 27 (see FIG. 2) to allow the wordline to be selected for a read or a write operation.

While the invention has been particularly shown and described with reference to preferred embodiments thereof, it will be understood by those skilled in the art that various changes in form and details may be made without departing from the spirit and scope of the invention.

What is claimed is:

1. A simultaneous read-write memory, comprising:
    a memory formed in a plurality of sections and each section containing a plurality of memory cells organized in rows and columns,
    a write wordline decoder and a read wordline decoder,
    a wordline multiplexer connected to each section and selecting between the write wordline decoder and the read wordline decoder for each section of said plurality of sections,
    a write data path separate from a read data path,
    a first section of said plurality of sections written with data from said write data path simultaneous to a second section of said plurality of sections being read using said read data path.

2. The memory of claim 1, wherein said first section and said second section perform simultaneous read and write operations using said first section for write and said section for read.

3. The memory of claim 1, wherein said read data path and said write data path are separate data paths.

4. The memory of claim 1, wherein a first wordline connected to said wordline multiplexer of each memory section is connected to output of the write wordline decoder and a second wordline connected to said wordline multiplexer of each memory section is connected to output of the read wordline decoder.

5. A method of simultaneous read-write, comprising:
    1) forming a memory with a plurality of sections with each section having a wordline multiplexer,
    2) connecting a write wordline decoder and a read wordline decoder to said wordline multiplexer of each section,
    3) selecting with a first multiplexer the write wordline for a first memory section of the plurality of memory sections and simultaneously selecting with a second multiplexer the read data wordline for a second memory section of the plurality memory sections,
    4) writing data to said first memory section using a write data path and simultaneously reading data from said second memory section using a read data path.

6. The method of claim 5, wherein the read data path and the write data path are separate paths.

7. A memory with simultaneous read and write means, comprising:
    a memory means,
    a read decoder means and a write decoder means,
    a multiplexer means to select between said read decoder means and said write decoder means,
    a read data path means and a write data path means connected to memory cells to allow simultaneous reading and writing of said memory means.

8. The memory of claim 7, wherein said memory means is partitioned into a plurality of sections each section with multiplexer means.

9. The memory of claim 8, wherein each section of said plurality of sections has a read data path means separate from said write data path means.

10. The memory of claim 8, wherein data can be read from a first section using said read decoder means, the multiplexer means, and said read data path means, while simultaneously data can be written to a second section using said write decoder means, the multiplexer means and said write data path means.

* * * * *

UNITED STATES PATENT AND TRADEMARK OFFICE
CERTIFICATE OF CORRECTION

PATENT NO. : 6,377,492 B1
DATED : April 23, 2002
INVENTOR(S) : Bor-Doou Rong and Gyh-Bin Wang It is certified that error appears in the above-identified patent and that said Letters Patent is hereby corrected as shown below:

<u>Title page,</u>
Item [73], Assignee, delete "Etron Technologies, Inc." and replace with -- Etron Technology, Inc. --.

Signed and Sealed this

Ninth Day of May, 2006

JON W. DUDAS
*Director of the United States Patent and Trademark Office*